United States Patent
Cho et al.

(10) Patent No.: US 6,523,563 B2
(45) Date of Patent: Feb. 25, 2003

(54) MODULAR GAS PANEL CLOSET FOR A SEMICONDUCTOR WAFER PROCESSING PLATFORM

(75) Inventors: Thomas Cho, Palo Alto, CA (US); Robert J. Navasca, Redwood City, CA (US); Tetsuya Ishikawa, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/797,219

(22) Filed: Feb. 28, 2001

(65) Prior Publication Data

US 2002/0011268 A1 Jan. 31, 2002

Related U.S. Application Data

(60) Provisional application No. 60/185,283, filed on Feb. 28, 2000.

(51) Int. Cl.$^7$ .............................. F16L 35/00; F16K 29/00
(52) U.S. Cl. ................... 137/338; 137/377; 137/382; 118/728
(58) Field of Search ................................. 137/377, 382, 137/338; 118/728

(56) References Cited

U.S. PATENT DOCUMENTS

| | | | | |
|---|---|---|---|---|
| 4,802,502 A | * | 2/1989 | Williams | 137/382 |
| 5,255,821 A | * | 10/1993 | Hall et al. | 222/39 |
| 5,350,479 A | | 9/1994 | Collins et al. | 156/345 |
| 5,674,039 A | * | 10/1997 | Walker et al. | 414/222 |
| 5,779,799 A | * | 7/1998 | Davis | |
| 5,915,444 A | * | 6/1999 | Seaman et al. | 137/377 |
| 5,952,060 A | * | 9/1999 | Ravi | 427/577 |
| 5,988,208 A | * | 11/1999 | Tudhope et al. | 137/382 |
| 6,113,694 A | * | 9/2000 | Davis | 118/663 |
| 6,157,450 A | * | 12/2000 | Marchese-Ragona et al. | 356/376 |

* cited by examiner

Primary Examiner—A. Michael Chambers
(74) Attorney, Agent, or Firm—Moser, Patterson & Sheridan

(57) ABSTRACT

An apparatus for providing facilities gas lines to a plurality of processing chambers. The apparatus comprises a rack having at least one modular gas control panel coupled thereto. A plurality of gas control panel feeds is coupled between the facilities gas lines and at least one gas control panel. Process gases are provided to individual chambers by a plurality of chamber gas lines are respectively coupled between at least one gas control panel and the plurality of processing chambers.

21 Claims, 9 Drawing Sheets

MODULAR GAS PANEL CLOSET FOR A SEMICONDUCTOR WAFER PROCESSING PLATFORM

CROSS REFERENCE

This application claims benefit of U.S. Provisional Application No. 60/185283, filed Feb. 28, 2000, which is hereby incorporated by reference in its entirety.

BACKGROUND OF THE DISCLOSURE

1. Field of Invention

The present invention relates generally to apparatus for processing semiconductor wafers. More specifically, the invention relates to a gas panel for supplying process gases to a wafer-processing platform.

2. Description of the Background Art

Integrated circuits have evolved into complex devices that include millions of transistors, capacitors and resistors on a single chip. The evolution of chip designs continually requires faster circuitry and greater circuit density. As the demand for integrated circuits continue to rise, chip manufactures have demanded semiconductor process tooling having increased wafer throughput and greater product yield. To meet this increase in throughput, tooling is being developed to process wider diameter wafers, for example, wafers having diameters of 300 millimeters (mm).

Wafer fabrication facilities provide electrical power, heat transfer fluid and/or gases, process gases, and the like to a wafer-processing platform such as a CENTURA® platform. The processing platform has one or more processing chambers, such as an ULTIMA HDP-CVD™ (High Density Plasma Chemical Vapor Deposition) chamber. Both the platform and chamber are available from Applied Materials, Inc. of Santa Clara, Calif. The fabrication facility typically routes multiple conduits providing such power, fluids, and gases beneath a floor or above the ceiling to each of the individual chambers. In an instance where more than one chamber is coupled to the processing platform, the independent routing of these conduits is time consuming and costly. As such, each chamber requires independently installed conduits and testing thereafter.

One solution to address the problem of complex conduit routing and plumbing is the use of a gas panel closet. The gas panel closets have a plurality of individual gas panels capable of providing and controlling the processing gases (e.g., argon, helium, and the like) to numerous processing chambers. For example, a typical gas panel closet comprises 4 independent gas panels that control the flow of the gases to four individual chambers. The gas panel closets are assembled at the wafer fabrication facility and then tested for operability and leaks.

One problem that has been identified is the extensive time it takes to assemble the gas panel closet. In particular, each component (e.g., regulators, manifolds, meters, valves, computer controllers, and the like) must be separately unpacked and installed onto a common structure. This assembly is repeated for each gas panel installed on the closet. Furthermore, if a part fails, then additional time is spent isolating the component that has failed, disassembling the gas panel closet to remove the failed component, reassembling the closet with the new component, and then re-testing the entire unit. As such, the assembly and testing costs per unit are increased.

Furthermore, four individual sets of facilities gas conduits must be provided for each gas panel. As such, where less than 4 chambers are coupled to the processing platform (e.g., only 2 chambers), the remaining two gas panels are not utilized and remain idle in the gas panel closet. Thus, the current gas panel closets are not cost effective to use where the processing platform is configured for less than four chambers.

Therefore, there is a need in the art for a gas panel closet that is capable of providing the required gases to a processing platform without having to rout individual conduits to each gas panel for each processing chamber. Furthermore, there is a need for a gas panel closet that allows flexibility at a wafer fabrication facility to quickly assemble various configurations of the gas panel closet without sacrificing assembly quality and increasing costs to the user.

SUMMARY OF INVENTION

The disadvantages associated with the prior art are overcome by the present invention of an apparatus for providing facilities gas lines to a plurality of processing chambers. The apparatus is a modular gas panel closet comprising a rack having at least one modular gas control panel coupled to the rack. A plurality of gas control panel feeds is coupled between the facilities gas lines and having at least one gas control panel. Process gases are provided to individual chambers by a plurality of chamber gas lines are respectively coupled between at least one gas control panel and the plurality of processing chambers.

Each modular gas control panel is preassembled and tested prior to installation onto the modular gas panel closet. In this manner each modular gas control panel is a subassembly that may be easily removed and installed as required. Specifically, as additional wafer processing chambers are added to or removed from a semiconductor wafer processing platform, a corresponding modular gas control panel is also added or may be removed as required. As such, the modular gas panel closet affords flexibility in that it is quickly assembled, tested, and maintained at a wafer fabrication facility.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAIL DESCRIPTION OF INVENTION

The present invention generally provides an apparatus for assisting in the processing of a semiconductor substrate. The invention is illustratively described below for use with a chemical vapor deposition chamber, such as an ULTIMA® High Density Plasma Chemical Vapor Deposition (HDP-CVD) system, available from Applied Materials, Inc. of Santa Clara, Calif. However, it should be understood that the invention may be incorporated into other chamber configurations such as physical vapor deposition chambers, etch chambers, ion implant chambers, and other semiconductor processing chambers that require various processing gases.

Figure 1:
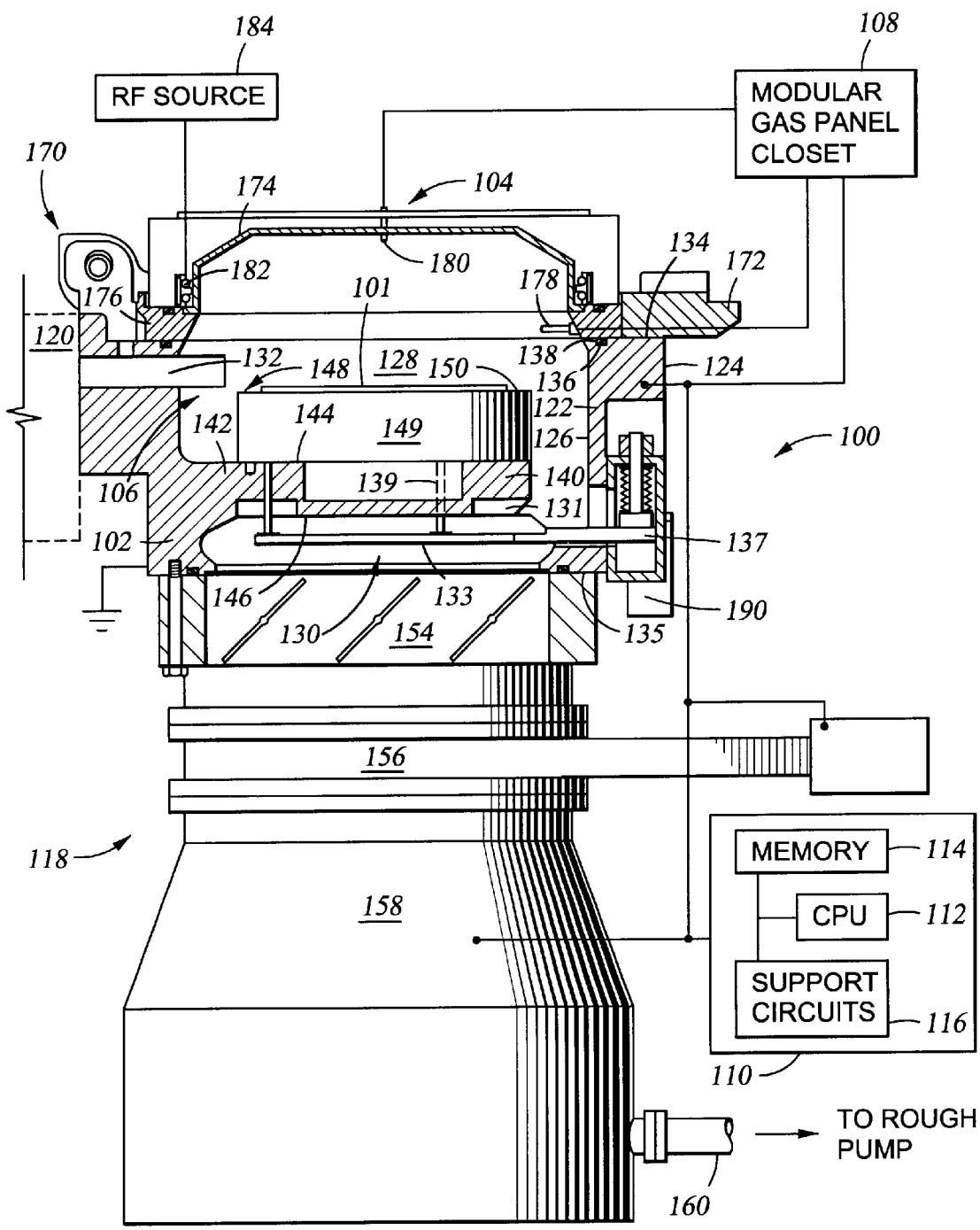
FIG. 1 depicts a cross sectional view of a semiconductor wafer-processing chamber connected to a modular gas panel closet of the present invention.

FIG. 1 depicts a partial cross section of a semiconductor processing system 100 of the present invention. Specifically, FIG. 1 depicts an illustrative HDP-CVD system (system) 100 generally comprising a chamber body 102 and a lid assembly 104, which define an evacuable chamber 106 for carrying out substrate processing. The system 100 may be one of a number of substrate processing systems that are coupled to a processing platform 120, such as a CENTURA® processing platform, which is available from Applied Materials, Inc.

The system 100 further comprises a pumping stack 118, a modular gas panel closet 108, and a controller 110. The controller 110 has a central processing unit (CPU) 112, memory 114, and memory support circuits 116. The controller 110 is coupled to the various components of the system 100 to facilitate control of the wafer processing. The chamber body 102 is typically a unitary, machined structure fabricated from a durable material such as aluminum. The chamber body 102 has a plurality of sidewalls 122 having a substantially rectangular outside surface 124 and an annular, inner surface 126. The annular, inner surface 126 of the chamber body 102 generally tapers to define an exhaust passage 130. Furthermore, at least one sidewall 122 is electrically grounded. The chamber body 102 contains a substrate entry port 132 that is selectively sealed by a slit valve (not shown) disposed in the processing platform 120.

The chamber body 102 further comprises a substrate support platform 140 coupled to the sidewall 122 by one or more support arms 142 (only one shown). The support arms 142 extend radially between the support platform 140 and the sidewall 122, thereby positioning the support platform 140 in the center of the chamber 106. The support platform 140 comprises a first surface 144 for supporting a support assembly 148 and a second surface 146 that faces the exhaust passage 130. A substantially C-shaped slot 131 circumscribes the second surface 146 to provide room for a lift-pin arm 133 having a distal end 137, which is coupled to an actuator assembly 190. The lift-pin arm 133 actuates a plurality of lift-pins 139 during wafer processing. For a detailed understanding of the C-shaped slot 131, lift-pin arm 133, lift-pins 139, and actuator assembly 190, the reader is directed to the drawings and the detailed description in commonly assigned U.S. Application titled "Semiconductor Wafer Support Lift-pin Assembly", authored by Gujer et al., Docket No. 4352/PDD/KPU3/JW, filed concurrently with this application, and incorporated herein by reference.

The substrate support assembly 148 is disposed on the first surface 144 of the support platform 140. The substrate support assembly 148 generally comprises a substrate support 150 and a cathode base 149. The substrate support 150 may be a susceptor, a heater, ceramic body, or electrostatic chuck on which the substrate or wafer 101 is placed during processing. For a detailed understanding of the. substrate support assembly 148 structure, the reader should refer to the drawings and the detailed description in commonly assigned U.S. Application Ser. No. 09/797,211 titled "Chemical Vapor Deposition Chamber", authored by Gujer et al., filed concurrently with this application, and incorporated herein by reference. Furthermore, for a detailed understanding of the operation of the electrostatic chuck in the chamber 106 during wafer processing, the reader should refer to the drawings and the detailed description in commonly assigned U.S. Pat. No. 5,350,479, issued Sep. 27, 1994, and incorporated herein by reference.

Centrally disposed between the second surface 146 of the substrate support assembly 148 and a lower surface 135 of the chamber body 102 is the exhaust passage 130. The lower surface 135 defines a generally flat landing area, which also communicates with the pumping stack 118. The pumping stack 118 includes a throttle valve assembly 154, a gate valve 156 and a turbomolecular pump 158. The pumping stack 118 is mounted to the exhaust passage 130 of the chamber body 102 to provide pressure control within the system 100. A line 160 couples the turbomolecular pump 158 to a remote mainframe or roughing pump (not shown), which evacuates the chamber 106 to a vacuum level within the operational range of the turbomolecular pump 158.

An upper surface 134 of the chamber body 102 defines a generally flat landing area on which the lid assembly 104 is supported. An o-ring groove 136 is formed in the upper surface 134 of the sidewall 122 to receive an o-ring 138 that forms a gas-tight seal between the chamber body 102 and the lid assembly 104. The lid assembly 104 generally includes a lid 172, a hinge assembly 170, a dome 174 and a gas distribution ring 176. The lid 172 is coupled to the dome 174 and gas distribution ring 176. The lid 172 is typically fabricated from aluminum. For a detailed understanding of the lid assembly 104, the reader should refer to the drawings and the detailed description in commonly assigned U.S. Application Ser. No. 09/797,161 titled "Chemical Vapor Deposition Chamber Lid Assembly", authored by Pang et al., filed concurrently with this application, and incorporated herein by reference. That application teaches a lid having a dual pivot hinge assembly, which is manufactured by Applied Materials, Inc. of Santa Clara, Calif. Together, the dome 174, sidewalls 122, and substrate support assembly 148 define a processing region 128.

At least one antenna or coil 182 is wound external to the dielectric dome 174. The coil 182 is powered by a variable frequency RF power source 184. The RF power source 184 includes a RF matching network to transfer power to plasma generated in the processing region 128. Disposed above the dome 174 is a temperature control assembly (not shown) that is utilized to regulate the temperature of the dome 174 during the various process cycles, i.e., deposition cycle and cleaning cycle. Typically, the dome 174 is heated during cleaning cycles and cooled during processing. A temperature control assembly in a semiconductor wafer processing system is disclose in U.S. patent application, titled "Apparatus For Cleaning A Semiconductor Process Chamber", Ser. No. 09/721,060, issued Nov. 21, 2000, now U.S. Pat. No. 6,363,624, filed Apr. 2, 2002, and assigned to the same assignee as the present application, Applied Materials, Inc., of Santa Clara, Calif. This application is incorporated by reference as if fully reproduced herein.

The gas distribution ring 176 is disposed between the dome 174 and the chamber body 102. The gas distribution ring 176 typically comprises an annular ring made of aluminum or other suitable material having a plurality of ports (not shown) formed therein for receiving nozzles 178 that are in communication the modular gas panel closet 108. The modular gas panel closet 108 may alternately be coupled to the chamber 106 via a showerhead or second nozzle 180 disposed beneath the dome 174. Optionally, both a showerhead and gas distribution ring 176 may be used in conjunction with each other.

In general, the modular gas panel closet 108 provides the process gases to one or more chambers 102, which are coupled to a processing platform 120. More specifically, the modular gas panel closet 108 illustratively provides processing gases selected from the group consisting of oxygen, argon, nitrogen fluoride, nitrogen, silicon fluoride, and silicon hydroxide during wafer processing as required. However, one skilled in the art will recognize that the modular gas panel closet 108 may distribute other types of gases, and the previously provided list shall not be viewed as a limiting example. The process gases to each chamber body 102 are individually controlled as described below.

Figures 2A, 2B:
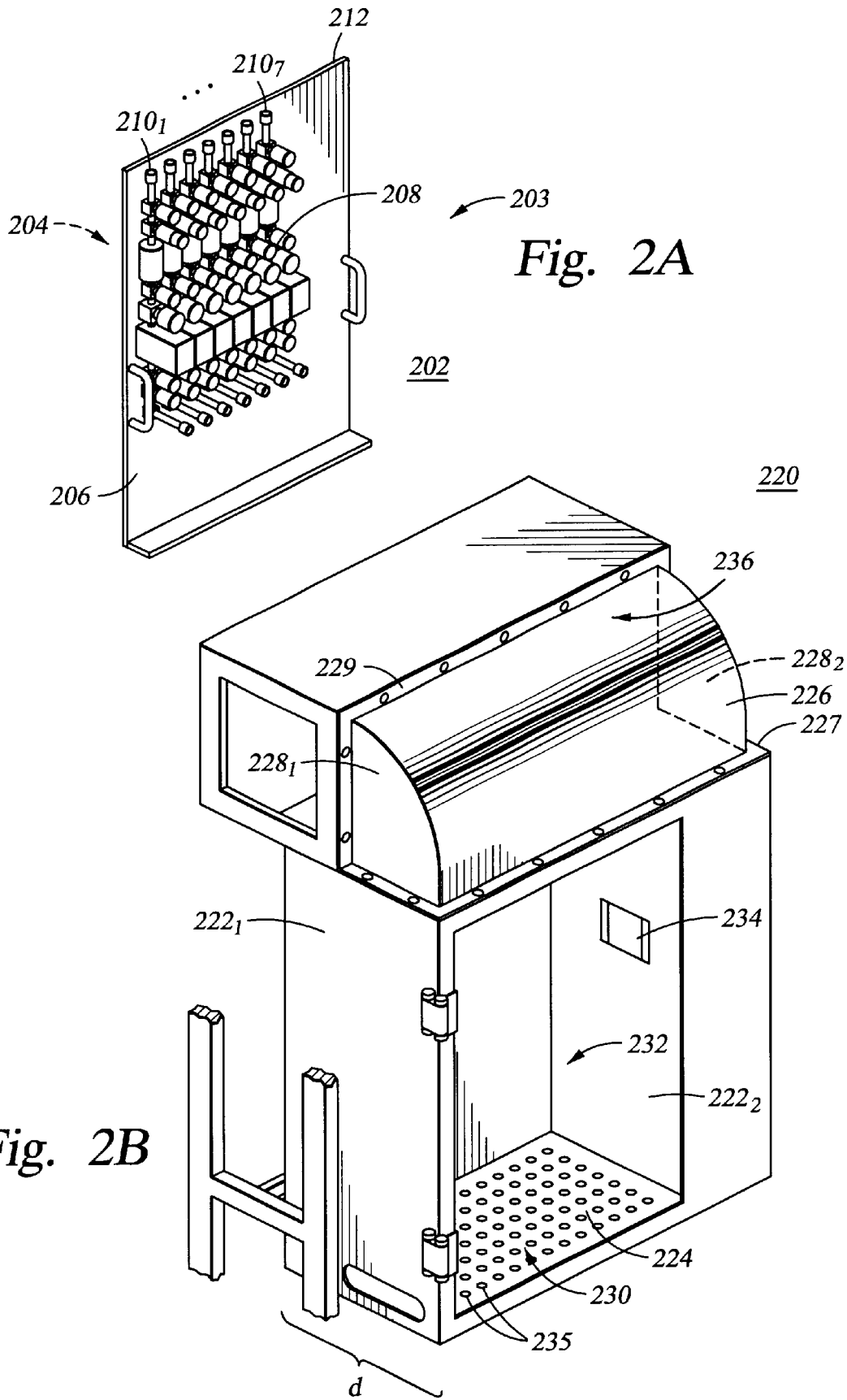
FIG. 2A depicts a perspective view of a modular process gas control panel.
FIG. 2B depicts a perspective view of a modular cabinet.

FIG. 2A depicts a perspective view of a modular gas control panel 202. In particular, the modular gas control panel 202 (hereinafter "control panel") comprises a panel 203 having backside 204 (obscured from view) and front side 206, and is fabricated from a substantially rigid and durable material such as aluminum, stainless steel, and the like. The control panel 202 facilitates various gas control components (i.e., controllers) 208 such as gas flow regulators, meters, manifolds, valve controls, pneumatics, computer controlled regulators, and the like for controlling the flow of gases from various facilities gas sources (not shown) to a particular processing chamber 102. The gases from the facilities supplies are received by a plurality of inlet port fittings $210_n$ (e.g., inlet ports (fittings) $210_1$ through $210_7$) illustratively located at the top 212 of the control panel 202. The gas control panel 202 may be one of a plurality of control panels utilized in the modular gas panel closet 108 of FIG. 1.

The components 208 are pre-assembled on the panel 203 and tested for operability prior to the entire modular gas control panel 202 being installed on the modular gas panel closet 108 at the wafer fabrication facility. As such, the control panel 202 is a "modular" subassembly, which is assembled and tested remotely, as opposed to simply being a plurality of components and a panel, which must be individually assembled locally at the fabrication facility. Pre-assembling and testing the control panel 202 is advantageous for numerous reasons as opposed to the prior art method of assembling and testing the control panels locally. One advantage is the ability to mass-produce the pre-assembled control panels 202. A second advantage is that the pre-assembled control panels 202 are tested at the manufacturing facility, thereby eliminating the need to disassemble the entire modular gas panel closet 108 at the wafer fabrication facility to replace defective components 208, which is extremely time consuming and costly. A third advantage is the interchangeability of the control panels 202. That is, all of the control panels 202 are the same and accordingly interchangeable, thereby eliminating the need for costly customization of parts.

FIG. 2B depicts a perspective view of a modular cabinet 220. The modular cabinet 220 houses the control panel 202 of FIG. 2A. The modular cabinet 220 comprises a plurality of opposing sidewalls $222_1$ and $222_2$ (collectively sidewalls 222), a bottom plate 224, a backside wall 232, and a hood 226. The hood 226 is an elbow shaped duct comprising a bottom portion 227, a top portion 229 and a pair of opposing side portions $228_1$ and $228_2$. One skilled in the art will recognize that the hood 226 may be configured in any shape, which functions as an air duct. The bottom portion 227 of the hood 226 is disposed over and parallel to the bottom plate 224. The opposing sidewalls 222 are coupled to the ends of the bottom portion 227 of the hood 226 and bottom plate 224 thereby forming a substantially rectangular shape. Furthermore, the length of each opposing side 222 is longer than the length of the control panel 202 to accommodate installation of the control panel 202 in the modular cabinet 220.

The backside wall 232 has a length approximately the same as the opposing walls, and a width approximately the same as the bottom portion 227 of the hood 226 and the bottom plate 224. Specifically, the backside wall 232 of the modular cabinet 220 extends in height from the bottom plate 224 to the bottom portion 227 of the elbow shaped hood 226, and between the opposing sides $222_1$ and $222_2$. As such a backside aperture 236 is defined and positioned between the backside wall 232 and the top portion 229 of the hood 226, and the opposing side portions $228_1$ and $228_2$ of the hood 226.

A depth "d" of the opposing sides 222, bottom plat 224, and bottom portion 227 of the hood 226 defines a front side aperture 230, which is opposite and parallel to the backside wall 232 of the cabinet 220. In addition, the front side aperture 230 of the modular cabinet 220 extends in height from the bottom plate 224 to the bottom portion 227 of the hood 226, and between the opposing sides 222.

Figure 2C:
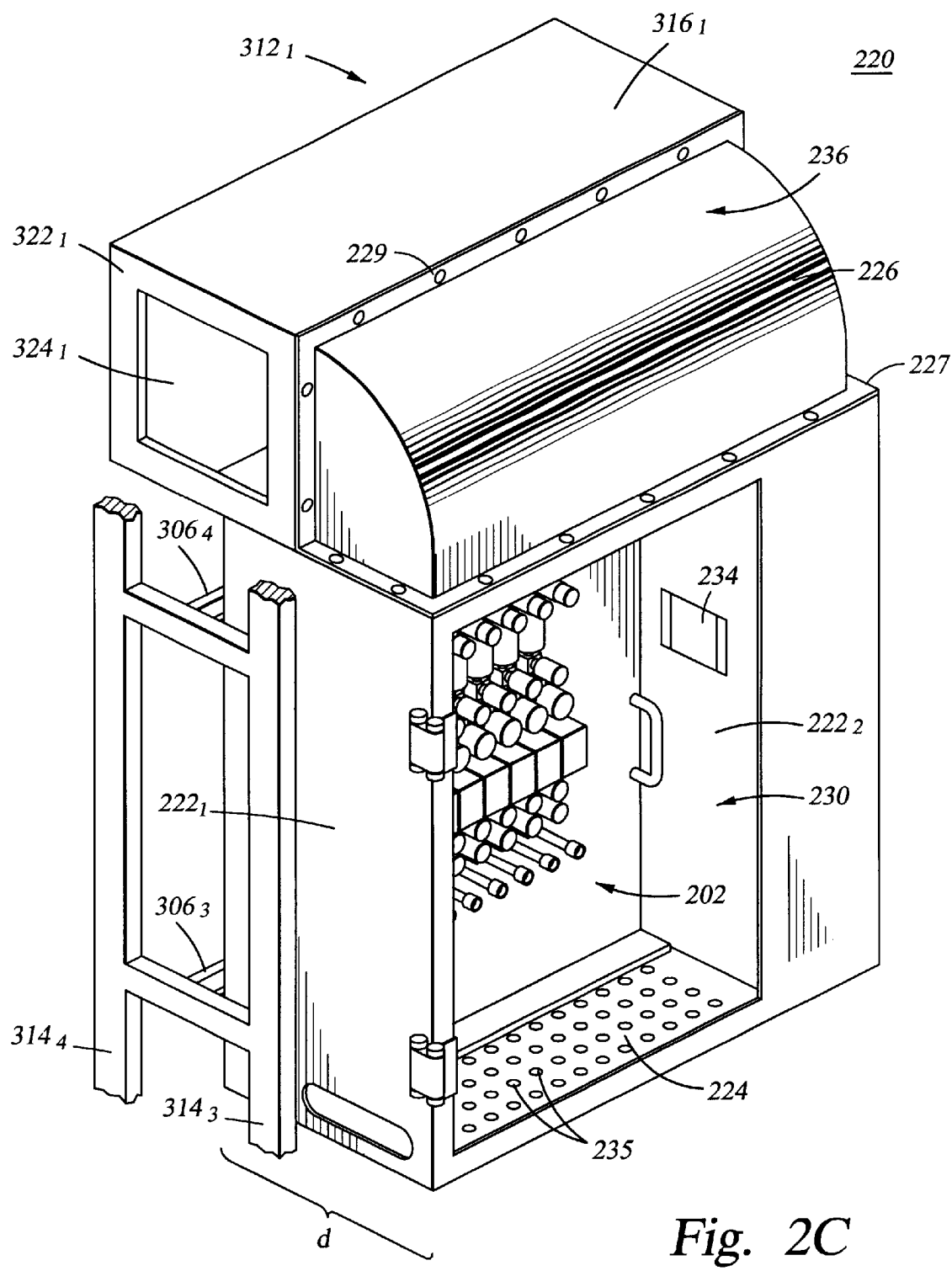
FIG. 2C depicts a perspective view of the modular process gas control panel of FIG. 2A disposed in the modular cabinet of FIG. 2B.

FIG. 2C depicts a perspective view of the modular gas control panel 202 of FIG. 2A disposed in the modular cabinet 220 of FIG. 2B. The modular cabinet 220 is sized to permit the modular gas control panel 202 to be mounted to the backside wall 232 of the modular cabinet 220. In one embodiment, the opposing sides 222 each comprise a flange (e.g., an L-shaped flange, not shown) extending outward (i.e., toward the front side aperture 230) to facilitate mounting the back 204 of the control panel 202 against the flange and over the backside wall 232 of the modular cabinet 220. Furthermore, a height of the sidewalls 222 is substantially equal to a height of the control panel 202. The control panel 202 is mounted adjacent to the bottom plate 224 and the opposing sidewalls 222 such that the backside aperture 236 adjacent to the hood 226 remains open. As such, the control panel 202 is installed over the backside wall 232 of the modular cabinet 220 such that the front 206 of the control panel 202 faces the front aperture 230 of the modular cabinet 220 and the backside aperture 236 remains unobstructed. Furthermore, a plurality of fasteners (e.g., bolts) is utilized to secure the back 204 of the control panel 202 against each flange. However, one skilled in the art will recognize that other mounting techniques for securing the control panel 202 may be utilized (e.g., a flange extending from the control panel 202 for attachment to the opposing sides 222, and the like).

In addition, a cabinet port 234 is defined in one of the sidewalls (e.g., sidewall $222_2$). The cabinet port 234 is utilized to provide access for a plurality of chamber gas feeds (not shown), which transport the gases regulated by the control panel 202 to the chamber 102. Furthermore, the front side aperture 230 is utilized to facilitate a door (not shown) to access the control panel 202. The modular cabinet 220 may be one of a plurality of modular cabinets 220 (e.g., 4 modular cabinets 220) utilized to house a plurality of control panels 202 in the modular gas panel closet 108. As such, the modular cabinets 220 protect the gas control panels 202 from the external environment. Furthermore, the modular cabinets 220 provide temperature regulation of the control panel 202 and modular gas panel closet 108 (as discussed below).

Figure 3:
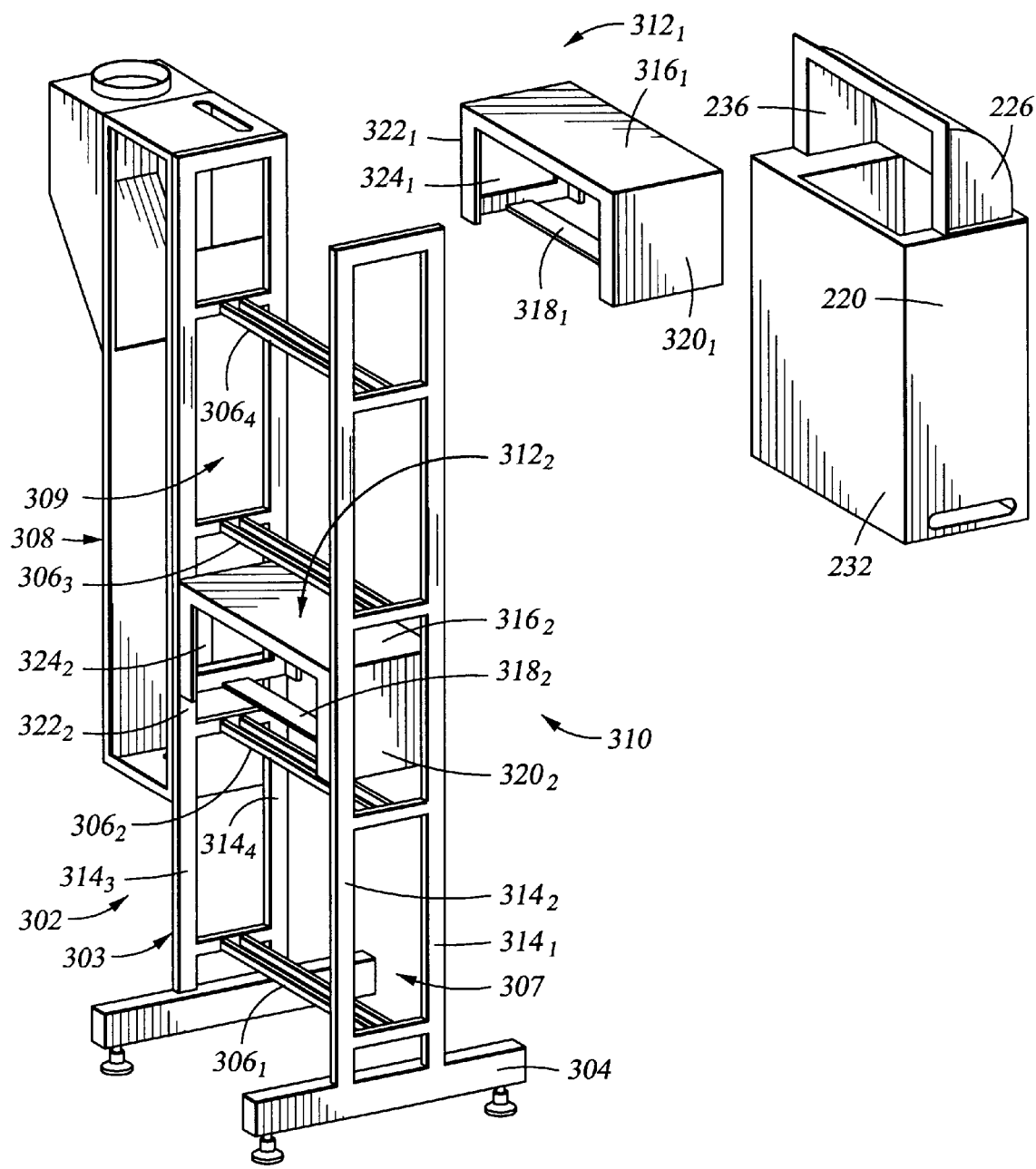
FIG. 3 depicts a perspective view of a rack of the modular gas panel closet of FIG. 1.

FIG. 3 depicts a rack 302 of the modular gas panel closet 108. The rack 302 may be fabricated from aluminum, stainless steel, and the like, and comprises a frame 303, a base 304, a plurality of cross-members $306_1$ through $306_4$ (only 3 of 4 cross-members 306 shown), and an upper and a lower air duct $312_1$ and $312_2$. In one embodiment the frame 303 comprises 4 frame legs $314_{1-4}$ mounted in pairs upon the base 304. For example, frame legs $314_1$ and $314_2$ form a first pair, and $314_3$ and $314_4$ form a second pair, wherein each pair is mounted on opposing sides of the base 304 thereby defining a rack front 308, a rack rear 310, a first side 307, and a second side 309. The cross-members 306 are secured between the pairs of frame legs 314 (e.g., frame legs $314_1$ and $314_4$, and frame legs $314_2$ and $314_3$) of the rack 302 to provide structure and support. Specifically, the cross-members 306 are mounted between the first and second sides 307 and 309, thereby forming a rectangular shaped frame 303.

Each air duct $312_1$ and $312_2$ comprises a top $316_1$ and $316_2$, a bottom $318_1$ and $318_2$, a first side $320_1$ and $320_2$, and a second side $322_1$ and $322_2$ having a air duct aperture $324_1$ and $324_2$ respectively. The air ducts $312_1$ and $312_2$ extend across between the first and second sides 307 and 309. In one embodiment, the upper air duct $312_1$ is mounted over and is supported by the fourth cross-member $306_4$, and the lower air duct $312_2$ is mounted over and is supported by the second cross-member $306_2$. As such, the top $316_1$ of the upper air duct $312_1$ defines a top surface of the modular gas panel closet 108.

The width of the rack 302 is sized to facilitate mounting of the modular cabinets 220 and their corresponding hoods 226. In one embodiment, the modular cabinets 220 slide between the frame legs 314 such that the opposing sides 222 of the modular cabinets 220 are adjacent to the frame legs 314. Furthermore, the backside walls 232 of the modular cabinets 220 abut the cross members 306 of the rack 302. For example, FIG. 2C depicts a modular cabinet (e.g., modular cabinet 220,) disposed between the frame legs $314_3$ and $314_4$ and the backside wall 232 resting against the cross-members $306_3$ and $306_4$.

Moreover, the hoods 226 are aligned with the air ducts 312 such that the lower portions 227 and top portions 229 of the hoods 226 are respectively aligned with the bottoms 318 and tops 316 of the air ducts 312. In this manner, air may flow from the front side 206 of the control panel 202 within the modular cabinet 220, through the hood 226 and backside aperture 236, and into the air duct 312.

Figure 6:
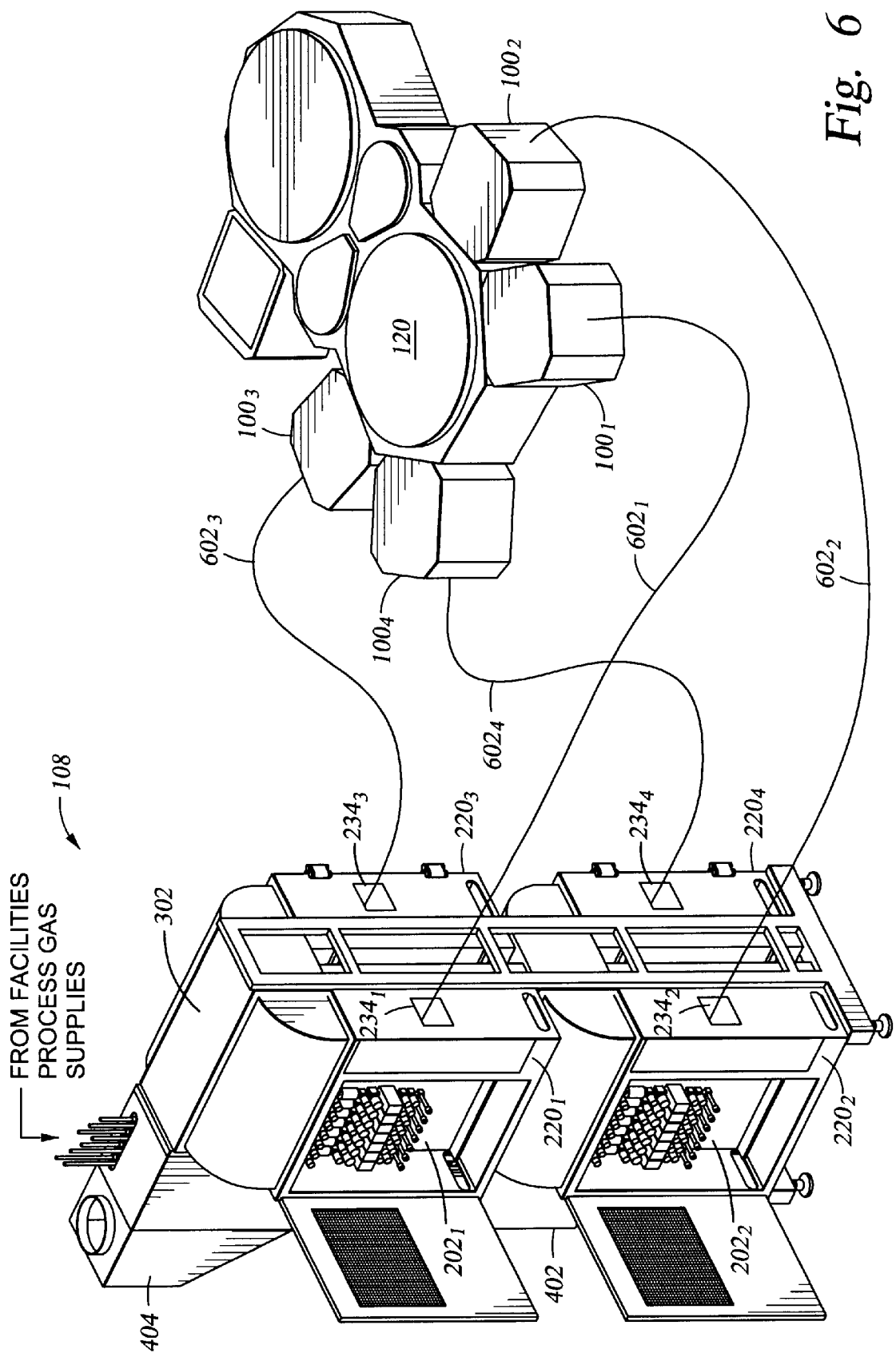
FIG. 6 depicts a perspective view of the modular gas panel closet coupled to a semiconductor wafer-processing platform.

In one embodiment, the opposing sidewalls 222 of the modular cabinets 220 are fastened to the frame legs 314 of the rack 302. Alternatively, the backside wall 232 of the modular cabinet 220 may be fastened to the cross-members 306 of the rack 302. Mounting of the modular cabinets 220 to the rack 302 is facilitated by fasteners such as bolts, screws, or any other fastener capable of rigidly securing the modular cabinet 220 thereon to the rack 302. In one embodiment, the frame 303 has a height greater than its width such that two modular cabinets 220 may be vertically mounted. Specifically, two modular cabinets 220 are vertically mounted on the front 308 and on the back 310 of the rack 302. Referring to FIG. 6 for example, modular cabinets $220_1$ and $220_2$ are mounted on the front 308 of the rack 302 and modular cabinets $220_3$ and $220_4$ are mounted on the rear 310 of the rack 302. As such, four independent modular cabinets 220 are mounted to the rack 302 to support four chambers 102 of a semiconductor processing system 100.

Figure 4:
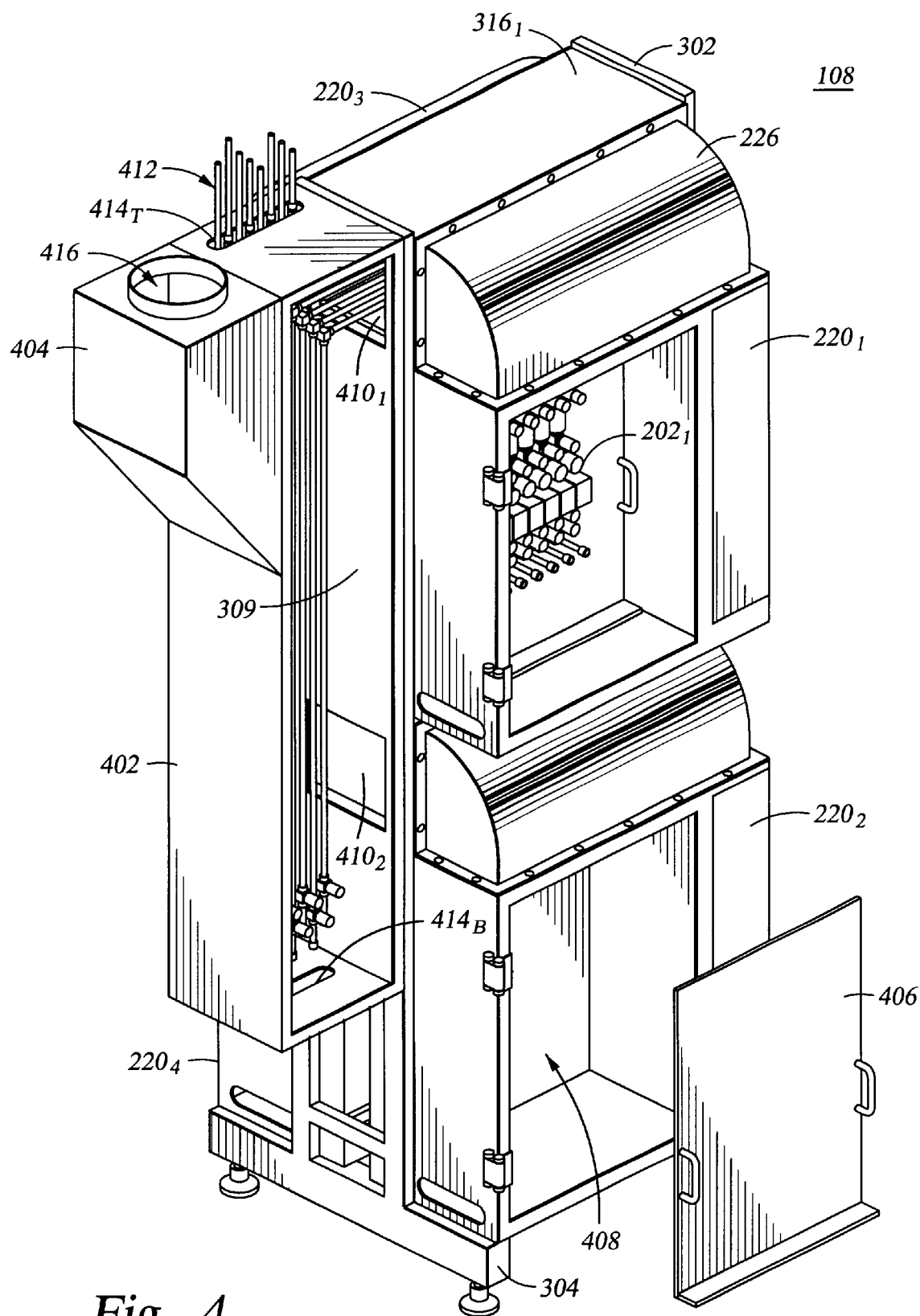
FIG. 4 depicts a second perspective view of the modular gas panel closet of FIG. 1.

FIG. 4 depicts a perspective view of the modular gas panel closet 108 of FIG. 1, and should be viewed along with FIGS. 2C and 3. In particular, FIG. 4 depicts a plurality of modular cabinets 220 (e.g., 4 modular cabinets $220_1$ through $220_4$) disposed on the front 308 and back 310 of the rack 302. In particular, two modular cabinets $220_1$ and $220_2$ are vertically mounted to the frame 303 at the front 308 of the rack 302. Similarly, two additional modular cabinets $220_3$ and $220_4$ are vertically mounted to the frame 303 on the back 310 of the rack 302. The control panel $202_1$ is illustratively installed in one of the modular cabinet $220_1$, and accordingly, three additional gas control panels may be installed in their respective modular cabinets $220_2$ through $220_4$ as required.

Each control panel 202 corresponds to a chamber 102 installed on the wafer-processing platform 120. As such, the modular gas panel closet 108 permits the removal and addition of the control panel 202 as required. In the instance where the second control panel $202_2$, or other gas control panels 202 are not required, then a corresponding blank panel 406 is mounted in place of the missing control panel (e.g., removed control panel $202_2$). The blank panel 406 may be fabricated from any rigid material such as aluminum, plastic, stainless steel, and the like, and is weighted to balance the modular gas panel closet 108. Such weighting of the blank panels 406 provides stability to the rack 302 in the absence of the gas control panels 202.

FIG. 4 further depicts the conduit track 402 disposed vertically on one of the sides of the rack 302 (e.g., the second side 309). The conduit track 402 facilitates coupling a plurality of facilities gas lines 412 from a manufacturing facility's gas sources (not shown) to the modular gas panel closet 108. In particular, the conduit track 402 extends from the top surface of the modular gas panel closet 108 (i.e., the top $316_1$ of the upper air duct $312_1$) down to approximately ¾ the length of the second side 309. Furthermore, the conduit track 402 includes an exhaust manifold 404 disposed adjacent to the topside $316_1$ and extending downward approximately a ⅓ of a length of the conduit track 402. A plurality of conduit track ports 410 is formed in the second side 309 (e.g., upper and lower conduit track ports $410_1$ and $410_2$). The conduit track ports 410 are axially aligned with the apertures 324 in the second side 322 of the air ducts 312. Specifically, the upper conduit track port $410_1$ is aligned with the aperture $324_1$ of the upper air duct $312_1$. Similarly, the lower conduit track port $410_2$ is aligned with aperture $324_2$ of the lower air duct $312_2$.

As such, temperature regulation of the modular gas panel closet 108 is facilitated. Specifically, air flows from the front 206 of the control panel 202 through the elbow shaped hood 226 and backside aperture 236 of the modular cabinet 220, and into the air duct 312. The air then flows through the apertures 324 of the second side 322 of the air ducts 312 and conduit track ports 410, up the conduit track 402 and out the exhaust manifold 404 through an exhaust stack 503 (see FIG. 5A). In this manner the heated air is centrally exhausted through the upper and lower air ducts $312_1$ and $312_2$ and conduit track 402. Moreover, any processing gases that may escape from the facilities gas lines 412 or any other gas conduit, valve, manifold, and the like disposed within the modular gas panel closet will also be exhausted out though the conduit track 402 and exhaust manifold 404.

Furthermore, the pressure in the air ducts 312 is kept at a level lower than the atmosphere such that air in front of the control panels 202 vents into the air ducts 312 via the hoods 226. Specifically, an exhaust fan (not shown) is provided in the exhaust stack 503 (see FIG. 5A) to quickly circulate and remove the air. Moreover, by limiting the exhaust flow through the air ducts 312, as opposed to the entire space behind each of the modular cabinets 220, the air flow demands within the rack 302 are thereby reduced, which also reduces the amount of energy required to exhaust the modular gas control closet 108.

Figure 5A:
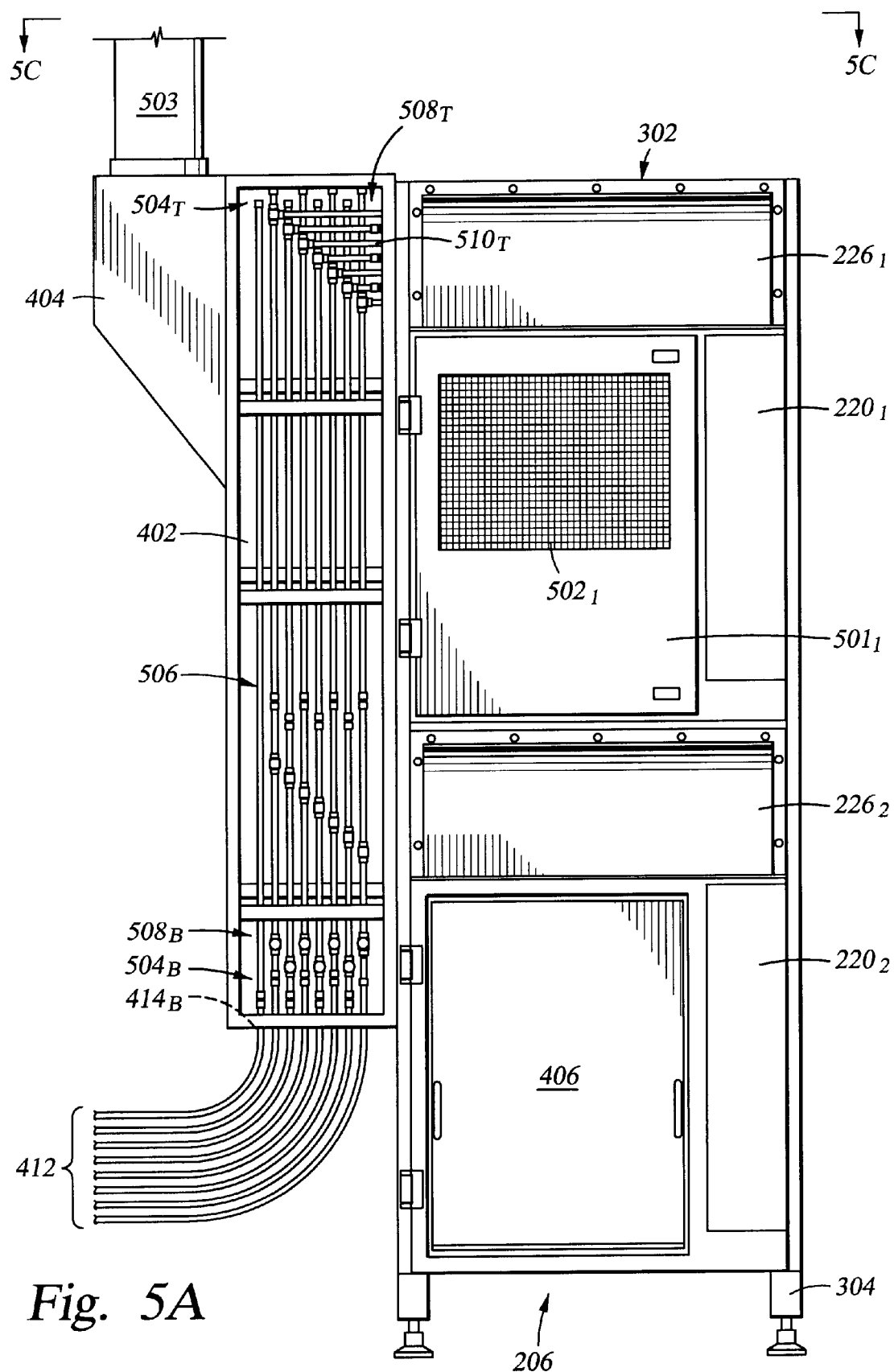
FIG. 5A depicts a side view of a conduit track of the modular gas panel closet of FIG. 4.

FIG. 5A depicts a side view of the modular gas panel closet 108 of FIG. 4. In particular, FIG. 5A depicts the front side 308 of the modular gas panel closet 108. A door 501 (e.g., door $501_1$) is disposed in the front aperture 230 of the modular cabinet 220 (e.g., modular cabinet $220_1$) and is illustratively in a closed position. Positioned behind the door $501_1$ is the control panel $202_1$. In order to further control and increase the airflow rate through the modular gas panel closet 108, each door 501 comprises the airflow vent 502 such as a screen, plurality of perforations, an air filtering material, and/or the like. Furthermore, the bottom plate 224 of each modular cabinet 220 may be perforated 235 (see FIG. 2B). The airflow vent 502 supplements the perforations 235 formed in the bottom plates 224 to improve heat transfer within the modular gas panel closet 108. In this manner, air enters through the vents and perforations 235 at the front 206 of the control panel 202 and flows through the modular gas panel closet 108 as described above.

Figure 5B:
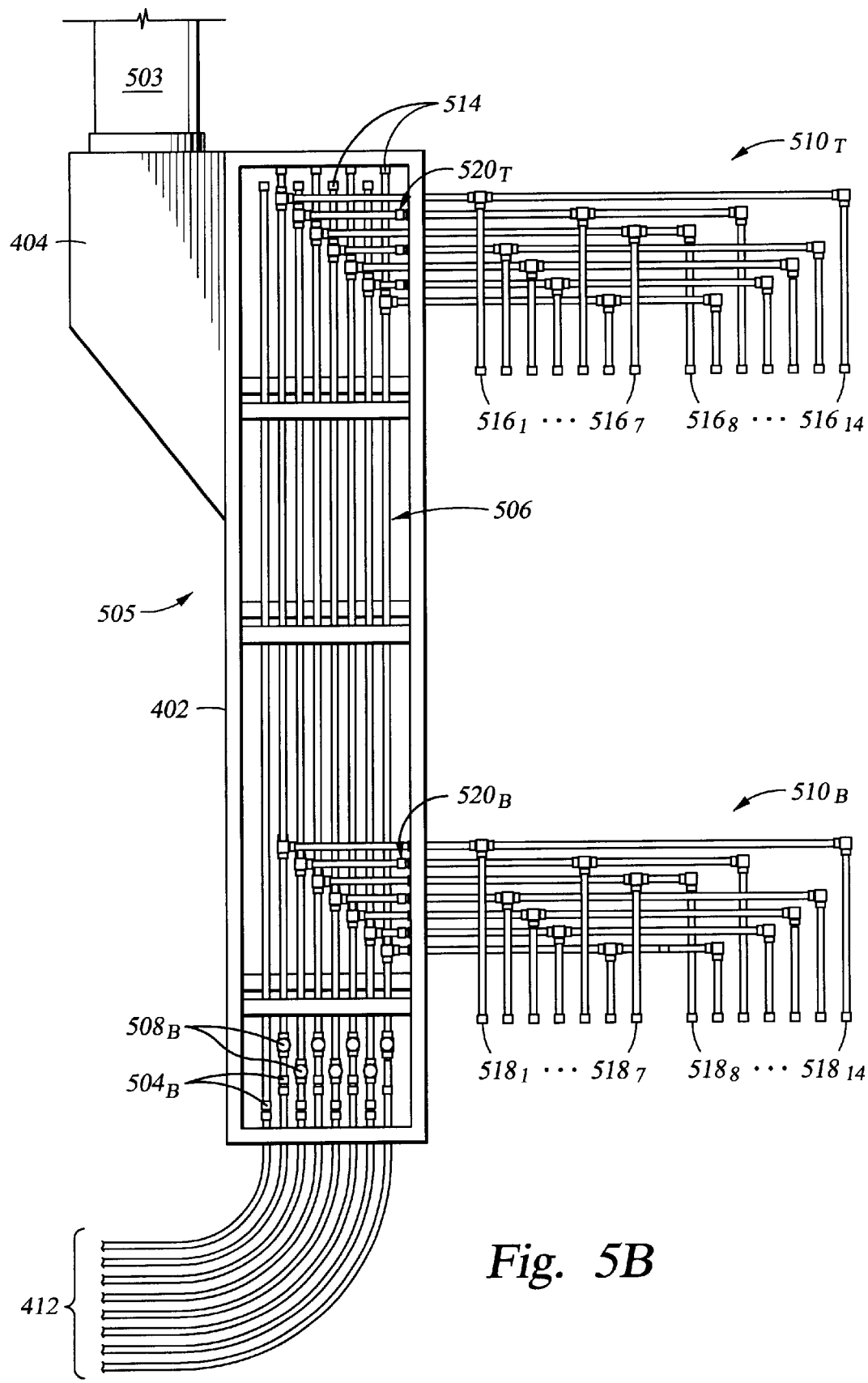
FIG. 5B depicts a schematic view of each gas panel feed line.
Figure 5C:
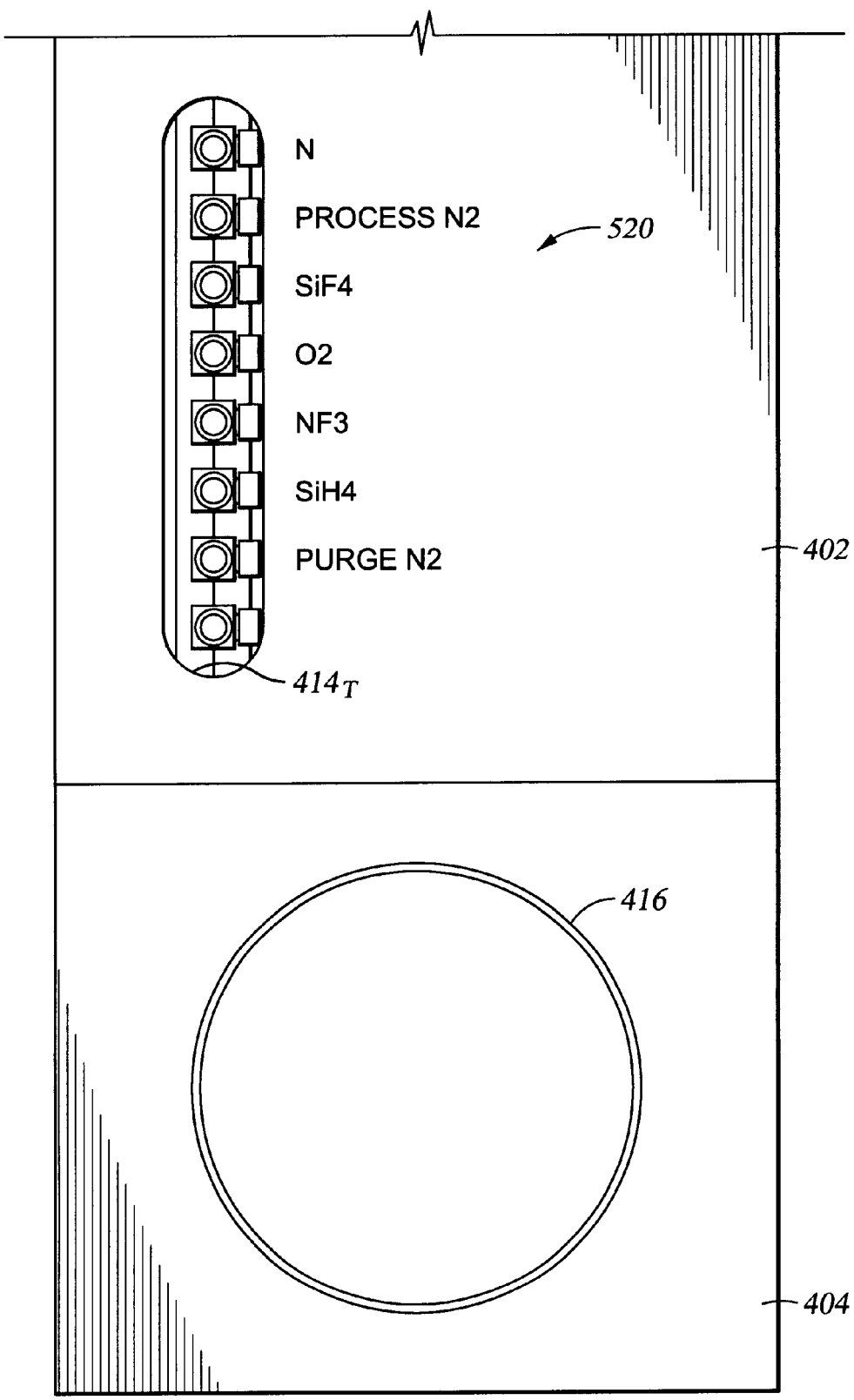
FIG. 5C depicts a gas feed port 414 of the conduit track.

FIG. 5C depicts a gas feed port 414 of the conduit track 402. The gas feed port 414 is marked with labels 520 to identify the various types of gases used for processing, and is preferably located on the top and bottom of the conduit track 402. FIG. 5C illustratively depicts one gas feed port $414_T$ located at the top of the conduit track 402, while a second gas feed port $414_B$ is located at the bottom the conduit track 402. Referring to FIG. 4, the facilities gas lines 412 (i.e., gas feeds) provide the various process gases to the chambers 102 from a facilities gas source (not shown). The facilities gas lines 412 are illustratively routed to the conduit track 402 through the gas feed port $414_T$ disposed in the top of the conduit track 402. Alternately, the facilities gas lines 412 may be illustratively routed beneath the floor and then enter the conduit track 402 through a bottom gas feed port $414_B$. In this manner, the facilities gas lines 412 may be routed from the gas source through either, illustratively, the ceiling or floor of the manufacturing facility to the conduit track 402 of the modular gas panel closet 108.

FIG. 5A also depicts a cross sectional view of the conduit track 402. FIG. 5B depicts a schematic view of the corresponding closet gas piping 505. The closet gas piping 505 comprises a plurality of track gas conduits 506, top and bottom gas conduit branches $510_T$ and $510_B$, and top and bottom gas panel feeds 516 and 518, and should be viewed in conjunction with FIG. 5A. The facilities gas lines 412 are depicted as being routed through the floor of the manufacturing facility and entering the conduit track 402 of the modular gas panel closet 108 via a bottom gas feed port $414_B$. The plurality of facilities gas lines 412 are respectively coupled to a plurality of track gas conduits 506 via a plurality fittings 504 (e.g., bottom fittings $504_B$), which are respectively coupled to a plurality of valves 508. The track gas conduits 506 extend towards the top of the conduit track 402 where the ends of each track gas conduit 506 is terminated with a cap 514.

The track gas conduits 506 branch off to provide gases to the upper control panels $202_1$ and $202_3$ and lower control panels $202_2$ and $202_4$ via a pair of gas conduit branches $510_T$ and $510_B$ respectively. Each gas conduit branch $510_T$ and $510_B$ is then split into top and bottom pair of gas panel feeds 516 and 518 respectively, which are then coupled to the control panel $202_1$ through $202_4$.

For example, in the embodiment depicted in FIGS. 5A–C, 7 track gas conduits 506 are split into top and bottom gas conduit branches $510_T$ and $510_B$. Additionally, each top gas conduit branch $510_T$ is further divided into a first pair of gas panel feeds 516. Specifically, the top gas panel feeds $516_1$ through $516_7$ are illustratively coupled to the inlet ports 210 of the first upper control panel $202_1$, and top gas panel feeds $516_8$ through $516_{14}$ are illustratively coupled to the inlet ports 210 of the second upper control panel $202_3$. Likewise, each bottom gas conduit branch $510_B$ is further divided into bottom gas panel feeds 518. Specifically, bottom gas panel feeds $518_1$ through $518_7$ are illustratively coupled to the inlet ports 210 of the first lower control panel $202_2$, and bottom gas panel feeds $518_8$ through $518_{14}$ are illustratively coupled to the inlet ports 210 of the second lower control panel $202_4$. Furthermore, it should be noted that the schematic drawing of FIG. 5B illustratively depicts the conduit branches 510 and gas panel feeds 516 and 518 as straight piping. However, one skilled in the art will understand that the conduit branches 510 and feeds 516 and 518 are actually shaped in any manner to facilitate coupling to the inlet ports 210 of the control panels 202.

As such, a single process gas supply for each type of process gas is first divided into a top and bottom branch $510_T$ and $510_B$, and subsequently divided into the individual control panel feeds 516 and 518. This ability to branch off with additional gas piping from the track gas conduits permits easy installation of the branches 510 and gas panel feeds 516 and 518 as required.

For example, if the processing platform 120 has only two chambers 102 coupled thereon, then only two modular gas control panels 202 are required to regulate the gases to those two chambers 102. If the two control panels 202 are installed on the bottom of the modular gas panel closet 108, then only the bottom gas conduit branch 510, and the corresponding bottom gas panel feeds 518 are required. If, subsequently, one or two additional chambers 102 are added to the processing platform 120, then the top gas conduit branch $510_T$ and the corresponding top gas panel feeds 516 are installed. Specifically, the top fittings $520_T$ are uncapped and the individual branches $510_T$ are coupled thereon. As such, the modular gas panel 108 is readily adapted for installation of one to four gas panels 202 simply by installing the gas piping as required. In this manner, the gas piping 505, that is, the track gas conduits 506, branches 510 and gas panel feeds 516 and 518 may be formed as kits having standard sizes and configurations, thereby eliminating customization of components and reducing per unit costs. Furthermore, testing need only be performed on the newly installed control panel(s) 202 and respective branches 510 and feeds 516 or 518, as required.

The conduit track 402 and track gas conduits 506 are designed to receive the facilities gas lines 412 from either the top or bottom of the conduit track 402. In the embodiment depicted in FIGS. 5A–C, where the facilities gas lines 412 are routed through the bottom of the conduit track 402, the plurality of bottom valves 508B is disposed near the bottom fittings $504_B$ and the track gas conduits 506 are capped at the top. Alternately, where the facilities gas lines 412 are routed through the top of the conduit track 402, a plurality of top valves (not shown) is disposed near the top fittings $504_T$ and the track gas conduits 506 are capped at the bottom. Thus, in either embodiment, the process gases pass through the track gas conduits 506 to the control panels 202 without any gases escaping.

FIG. 6 depicts a perspective view of the modular gas panel closet 108 coupled to the individual chambers $102_1$ through $102_4$ attached to the semiconductor wafer-processing platform 120. The modular gas panel closet 108 is coupled to individual chambers 102 via chamber gas lines $602_1$ through $602_4$ (collectively chamber gas lines 602). Each of the illustrative chamber gas lines (e.g., $602_1$) represents the plurality of process gas conduits for each type of process gas. In other words, each single chamber gas line 602 from each control panel 202 to each chamber 102 in FIG. 6, actually represents a plurality of chamber gas lines (e.g., the seven individual gas lines providing oxygen, argon, nitrogen fluoride, nitrogen, silicon fluoride, silicon hydroxide, and the like).

In particular, the chamber gas line $602_1$ is coupled from the gas control panel $202_1$ passes through cabinet port $234_1$ of the modular cabinet $220_1$, and extends to the chamber $102_1$. Furthermore, chamber gas lines $602_2$ through $602_4$ are coupled to the modular gas panel closet 108 and respective chambers 102 in a similar manner. As such, the gas control panels 202 are utilized to regulate the flow of processing gases for each chamber 102 of the platform 120. Furthermore, the gas lines 602 are preferably routed and coupled to the chambers 102 via a path having the least distance. As such, the chamber gas lines $602_3$ and $602_4$ are illustratively routed to chambers $102_3$ and $102_4$. Likewise, the chamber gas lines $602_1$ and $602_2$ are illustratively routed to chambers $102_1$ and $102_2$.

Moreover, each of the individual chamber gas lines 602 is coupled a cutoff valve (not shown) disposed proximately the back 204 of the control panel 202. The chamber gas line cutoff valves permit the individual control panels 202 to be removed and installed without leaking the process gases.

Wafer-processing requirements vary according to the type of wafer being produced. Some wafers may require etching and deposition processes, while other processes may only require deposition processes, and so forth. As such, according to the particular recipe, the number of chambers 102 utilized in a particular platform 120 may also vary. When all the chambers 102 in the platform are not required, the processing personnel only needs to close the cutoff valves 508 to the specific chamber gas lines 602 that are respectively coupled to these non-utilized chambers 102. This provides the processing personnel with the option to remove these non-utilized chambers 102 for maintenance or use elsewhere. Likewise, the control panels 202 corresponding to the non-utilized chambers 102 may also be removed for maintenance or use elsewhere. Therefore, the modular design of the modular gas panel closet 108 alleviates extensive changes to the fabrication facility when one or more chambers 102 and/or control panels 202 are added or removed to the platform 120.

Additionally, the vertically stacked, front to back orientation of the control panels 202 provides ease of accessibility, as well as allowing for a smaller footprint at the facility for installation of the modular gas panel closet 108. Furthermore, the modular gas panel closet 108 may be couple to the facility's process gas supplies from either above the ceiling or below the floor. These additional features provide versatility in installation, operation, and maintenance, which also contribute to a reduced cost of ownership.

Although the teachings of the present invention that have been shown and described in detail herein, those skilled in the art can readily devise other varied embodiments that still incorporate the teachings and do not depart from the spirit of the invention.

What is claimed is:

1. An apparatus for providing facilities gas lines to at least one processing chamber, comprising:

a rack having an upper air duct and a lower air duct;

at least one modular gas control panel comprising at least one gas control device; and wherein each said at least one mnodular gas control panel is coupled to said rack and respectively facilitates coupling between said facilities gas lines and each said processing chamber.

2. The apparatus of claim 1 wherein said upper air duct and said lower air duct are maintained at a pressure level lower than atmospheric pressure.

3. The apparatus of claim 1 wherein said rack is rectangular in shape.

4. The apparatus of claim 1 wherein a pair of said modular gas control panels are mounted on opposing sides of said rack.

5. The apparatus of claim 4 wherein each said pair of said plurality of modular gas control panels are positioned vertically.

6. The apparatus of claim 1 further corprising:

a plurality of modular cabinets coupled to said rack, wherein each said modular gas control panel is disposed in one of said plurality of modular cabinets.

7. The apparatus of claim 6 wherein each said modular cabinet comprises:

a pair of opposing sides;

a bottom plate coupled between said opposing sides;

a backside wall coupled between said opposing sides and to said bottom plate; and a hood coupled between said opposing sides and parallel to said bottom plate thereby defining a front side aperture and backside aperture; and a door disposed in said front side aperture.

8. The apparatus of claim 7 wherein said backside aperture is aligned with said at least one air duct.

9. The apparatus of claim 6 wherein said bottom plate has perforations formed therein.

10. The apparatus of claim 6 wherein said door has an airflow vent formed therein.

11. The apparatus of claim 6 wherein said modular cabinet further comprises a cabinet port.

12. The apparatus of claim 6 wherein a blank panel is installed in said backside aperture in the absence of a modular gas control panel.

13. The apparatus of claim 12 further comprising a conduit track coupled to a side of said rack and adjacent to said at least one modular gas control panel wherein said facilities gas lines are routed through said conduit track.

14. The apparatus of claim 13 wherein said conduit track further comprises an exhaust manifold positioned on an upper portion of said conduit track.

15. The apparatus of claim 14 wherein said conduit track further comprises an upper and a lower conduit track port respectively communicating with said upper and lower air ducts.

16. The apparatus of claim 13 wherein said conduit track facilitates a plurality of track gas conduits respectively coupled to said facilities gas lines.

17. The apparatus of claim 15 wherein said facilities gas lines are routed through an upper gas feed port of said track conduit.

18. The apparatus of claim 15 wherein said facilities gas lines are routed through a lower gas feed port of said track conduit.

19. The apparatus of claim 16 wherein a plurality of gas conduit branches are coupled between said track gas conduits and said modular gas control panel.

20. The apparatus of claim 17 wherein a plurality of gas panel feeds are coupled between said plurality of gas conduit branches and said modular gas control panel.

21. The apparatus of claim 1 wherein said modular gas control panel comprises a panel having gas control devices pre-assembled thereon.

* * * * *

UNITED STATES PATENT AND TRADEMARK OFFICE
CERTIFICATE OF CORRECTION

PATENT NO.    : 6,523,563 B2
DATED         : February 25, 2003
INVENTOR(S)   : Thomas Cho, Robert J. Navasca and Tetsuya Ishikawa It is certified that error appears in the above-identified patent and that said Letters Patent is hereby corrected as shown below:

Column 6,
Line 24, please change "plat" to -- plate --.

Column 12,
Line 8, please change "mnodular" to -- modular --.
Line 25, please change "corprising:" to -- comprising: --.

Signed and Sealed this

Thirteenth Day of May, 2003

JAMES E. ROGAN
*Director of the United States Patent and Trademark Office*